(12) United States Patent
Uematsu et al.

(10) Patent No.: US 7,990,228 B2
(45) Date of Patent: Aug. 2, 2011

(54) SEMICONDUCTOR DEVICE AND WIRING PART THEREOF

(75) Inventors: Yutaka Uematsu, Hachioji (JP); Hideki Osaka, Kokubunji (JP); Yoji Nishio, Tokyo (JP); Eiichi Suzuki, Tokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 460 days.

(21) Appl. No.: 12/060,941

(22) Filed: Apr. 2, 2008

(65) Prior Publication Data
US 2008/0266031 A1 Oct. 30, 2008

(30) Foreign Application Priority Data
Apr. 3, 2007 (JP) .................. 2007-097380

(51) Int. Cl.
*H04B 3/28* (2006.01)
(52) U.S. Cl. ..................... 333/12; 333/204; 333/247
(58) Field of Classification Search ........... 333/12, 333/204, 205, 247; 438/667–675
See application file for complete search history.

(56) References Cited

U.S. PATENT DOCUMENTS

| | | | | |
|---|---|---|---|---|
| 7,298,050 B2 * | 11/2007 | Kurihara et al. | ............. | 257/774 |
| 7,612,449 B2 * | 11/2009 | Gagne et al. | ................. | 257/738 |
| 2005/0218502 A1 | 10/2005 | Sunohara et al. | | |
| 2006/0180938 A1 * | 8/2006 | Kurihara et al. | ............. | 257/773 |
| 2007/0242440 A1 | 10/2007 | Sugaya et al. | | |

FOREIGN PATENT DOCUMENTS

| | | |
|---|---|---|
| JP | 2005-294383 | 10/2005 |
| JP | 2006-216755 | 8/2006 |

* cited by examiner

*Primary Examiner* — Robert Pascal
*Assistant Examiner* — Kimberly E Glenn
(74) *Attorney, Agent, or Firm* — Antonelli, Terry, Stout & Kraus, LLP.

(57) ABSTRACT

A technique capable of achieving both improvement of mounting density and noise reduction for a semiconductor device is provided. An LSI mounted on a printed wiring board comprises a grounding BGA ball and a power BGA ball to get power supply from the printed wiring board, and the grounding BGA ball and the power BGA ball are arranged closely to each other. A decoupling capacitor is mounted on the printed wiring board and has a first terminal and a second terminal. The grounding BGA ball and the first terminal are connected by a first metal electrode plate, and the power BGA ball and the second terminal are connected by a second metal electrode plate. The first metal electrode plate and the second metal electrode plate interpose a dielectric film having a thickness equal to or smaller than 1 μm therebetween.

33 Claims, 5 Drawing Sheets

SEMICONDUCTOR DEVICE AND WIRING PART THEREOF

CROSS-REFERENCE TO RELATED APPLICATION

The present application claims priority from Japanese Patent Application No. JP 2007-097380 filed on Apr. 3, 2007, the content of which is hereby incorporated by reference into this application.

TECHNICAL FIELD OF THE INVENTION

The present invention relates to a technique of a semiconductor device. More particularly, the present invention relates to a technique of mounting technology for achieving both of power supply noise reduction and high-density mounting of mounting parts in semiconductor devices.

BACKGROUND OF THE INVENTION

In some techniques which the inventors of the present invention have studied, as for semiconductor devices, the following technique has been considered.

In recent years, along with improvement of operational frequency and increase of consumption current in LSIs (Large Scale Integrated Circuits) among semiconductor devices, power supply noise has been to be increasing. On the other hand, according to the trend of lowering operational voltage along with developments of semiconductor manufacturing process, noise margin has been decreased. This has made the power-supply noise design very difficult.

While means for reducing power noise differs by frequencies, for frequencies from several hundreds of kHz to several tens of MHz which are so-called the low frequency band to the medium frequency band, a noise countermeasure to reduce impedance by a decoupling capacitor on a printed wiring board has been made. Among the above said frequencies, the capacitance of the decoupling capacitor is a dominant parameter in lowering impedance for the lower frequencies (several hundreds of kHz to several MHz), and the value of the inductance connecting the decoupling capacitor and LSI is a dominant parameter for the higher frequencies (several MHz to several tens of MHz). In other words, it is indispensable to connect a decoupling capacitor having a large capacity to the power supply terminal of LSI with a low inductance for lowering impedance of the target frequency range. Further, it is required to adjust the kind, number and method of mounting decoupling capacitors so as to make the impedance equal to or smaller than a desired value compliant to the system.

Figure 9:
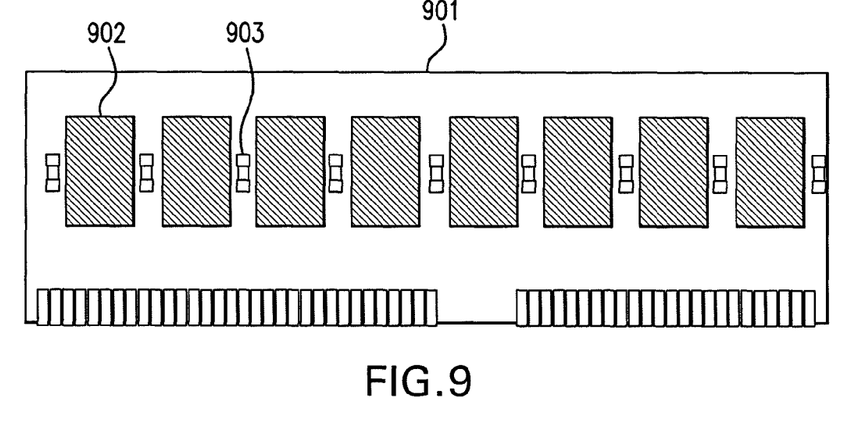
FIG. 9 is a planer view showing a configuration example of a memory module which has been studied as a premise of the present invention.

In FIG. 9, an example of mounting a decoupling capacitor is shown. FIG. 9 is a planer view showing an example of a configuration of a memory module which has been studied as a premise of the present invention. As shown in FIG. 9, a plurality of LSIs 902 such as DRAMs are mounted on a printed wiring board 901, and a decoupling capacitor 903 is arranged at the vicinity of a power terminal of each LSI 902 to be connected the power terminal, so that lower impedance and lower inductance can be obtained.

Note that, the inventors of the present invention have had a prior art search based on the result of their invention. As a result, they extracted Japanese Patent Application Laid-Open Publication No. 2006-216755 (Patent Document 1) and Japanese Patent Application Laid-Open Publication No. 2005-294383 (Patent Document 2).

Patent Document 1 has, as a whole, a main subject about embedding a capacitor in a sheet shape on an interposer board, where a thin-film capacitor is buried in the interposer, thereby achieving a low-ESL (Equivalent Series inductance) structure configured in combination with through-electrodes. But it does not use a thin-film capacitor to connect with a chip part on the printed wiring board unlike the present invention.

In addition, Patent Document 2 has, as a whole, a main subject about embedding a decoupling capacitor on a capacitor-mounting wiring board, where a capacitor is mounted on the capacitor-mounting wiring board so that, when a current is fed to the capacitor, the direction of the current becomes opposite to a current flowing through a wiring layer, thereby achieving low ESL. While Patent Document 2 describes a thin-film capacitor, the thin-film capacitor is not used as a power-supply path.

SUMMARY OF THE INVENTION

In the meantime, the inventors of the present invention have studied the technique of the semiconductor device as mentioned above, and as a result, the following factors has revealed.

According to the trend of power technology mentioned in the Background of the Invention part above, the target impedance has been lowered year by year, and so the method of mounting capacitors has been changed to correspond to the lowering of target impedance.

More particularly, so as to sufficiently suppress power noise of several tens of MHz band, a method of mounting a capacitor to connect an LSI and a decoupling capacitor by a low inductance has been actively applied. An important thing in lowering impedance is a method for reducing inductance in actual mounting.

Figure 10:
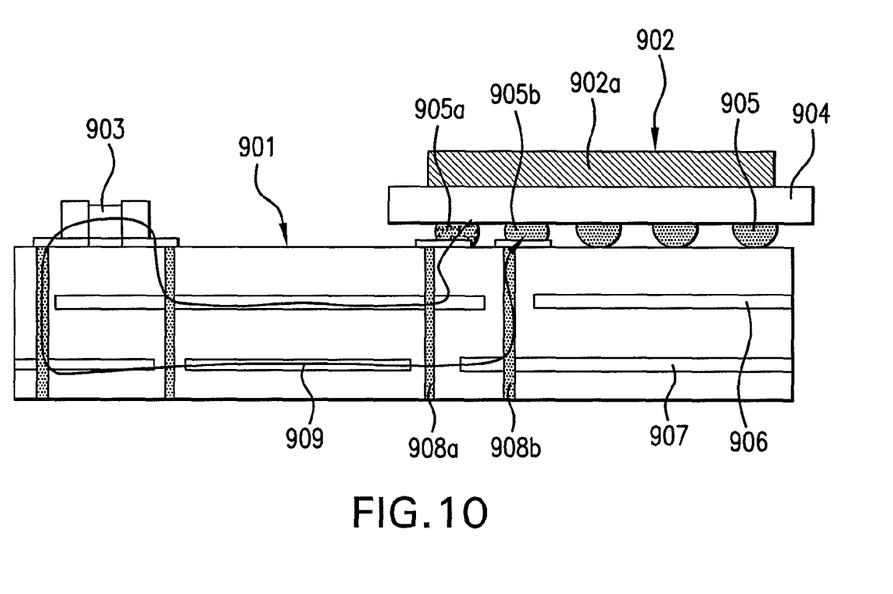
FIG. 10 is a cross-sectional view showing a mounting example of an LSI and a decoupling capacitor which has been studied as a premise of the present invention.

FIG. 10 shows an example of mounting an LSI and a decoupling capacitor. FIG. 10 is a cross-sectional view showing an example of mounting and wiring of an LSI and a decoupling capacitor which has been studied as a premise of the present invention. As shown in FIG. 10, an LSI 902 such as a DRAM and a decoupling capacitor 903 are mounted on a printed wiring board 901. The LSI 902 is configured by an LSI chip 902*a* and an LSI package 904. The LSI chip 902*a* is mounted on the LSI package 904, and each terminal of the LSI chip 902*a* including a power terminal is connected to a BGA (Ball Grid Array) ball 905 on a back surface of the LSI package 904. The BGA ball 905 is connected to each electrode on the printed wiring board 901. The printed wiring board 901 has a multilayer wiring structure, and embeds a power-supply layer 906 and a ground layer 907. A power-supply BGA ball 905*a* and the power-supply layer 906 are connected via a VIA (through-holt) 908*a*. Similarly, a power-supply (power) BGA ball 905*b* and the ground layer 907 are connected via a VIA 908*b*. In such a configuration, a current path 909 of an alternate-current component such as power noise between the power source and ground is shown by an arrow.

As shown in FIG. 10, there are a plurality of portions which pose inductances. Among these, main three parameters are: (1) mounting inductance of the decoupling capacitor (electrode, electrode wiring, VIA); (2) a power plane between the LSI and the decoupling capacitor; and (3) an ESL (Equivalent Series inductance) of the decoupling capacitor.

Conventionally, a method (A) by which the number of mounting decoupling capacitors is increased so that the above parameters (1) and (3) are made equivalently smaller, and a method (B) by which decoupling capacitor is mounted just close to the LSI so that the above parameter (2) is made smaller have been implemented.

However, in these methods, there have been problems in view of increasing number of parts and mounting density. For example, as for a memory module, the number of decoupling capacitors which had conventionally been several tens has increased to exceed 100 recently, and thus the number of decoupling capacitors is reaching the limit to mount on a module board. Further, as the size of a chip increases along with increasing the capacity of an LSI such as a DRAM, it has been getting difficult to ensure enough space to put a decoupling capacitor in a vicinity portion of the LSI on a module board.

As methods to solve these problems, there are methods to embed a thin-film capacitor and a chip capacitor in a layer inside the board just under the LSI (e.g., Patent Document 1 and Patent Document 2).

However, in the case of a thin-film capacitor, there is a problem that a sufficient capacitance cannot be obtained due to capacitance density and the existence of VIA. Further, in the case of embedding a chip capacitor, there are problems that: an increase of thickness of the board; there is no effect to reduce the mounting inductances corresponding to the electrode part and the VIA; and there is a limitation in the embeddable number of thin-film capacitors, and thus it is not expectable to obtain a sufficient effect of inductance lowering. Both methods have been insufficient in view of noise reduction effect.

Consequently, an object of the present invention is to provide a technique capable of achieving both of improvement of mounting density and noise reduction in a semiconductor device.

Further, another object of the present invention is to provide a technique capable of achieving reduction of the number of mounting parts in a semiconductor device.

The above and other objects and novel characteristics of the present invention will be apparent from the description of this specification and the accompanying drawings.

The typical ones of the inventions disclosed in this application will be briefly described as follows.

More particularly, a semiconductor device according to the present invention comprises a semiconductor integrated circuit and a printed wiring board mounting the semiconductor integrated circuit. And, the semiconductor integrated circuit has a first electrode and a second electrode for receiving power supply from the printed wiring board, and the first electrode and the second electrode are provided adjacent to each other. The printed wiring board mounts a decoupling capacitor, and the decoupling capacitor has a first terminal and a second terminal. The first electrode and the first terminal are connected by a first metal electrode plate, and the second electrode and the second terminal are connected by a second metal electrode plate. The first metal electrode plate and the second metal electrode plate interpose a dielectric film having a thickness equal to or smaller than 1 μm therebetween.

Further, a wiring part according to the present invention is aimed to be mounted on the printed wiring board to which the semiconductor integrated circuit is embedded, and it is an external wiring part for connecting a power-supply (power) electrode of the semiconductor integrated circuit and a decoupling capacitor. And, the wiring part includes: a first metal electrode plate having a first capacitor terminal to be connected to a first terminal of a decoupling capacitor and a first integrated circuit terminal to be connected to the first power electrode of the semiconductor integrated circuit; and a second metal electrode plate having a second capacitor terminal to be connected to a second terminal of the decoupling capacitor and a second integrated circuit terminal to be connected to a second power electrode of the semiconductor integrated circuit. The first metal electrode plate and the second metal electrode plate interpose a dielectric film having a thickness equal to or smaller than 1 μm therebetween, thereby forming a thin-film capacitor.

The effects obtained by typical aspects of the present invention will be briefly described below.

(1) Low inductance mounting enables a power noise reduction.

(2) Freedom of layout of capacitor parts is increased, thereby enabling high density mounting.

(3) The number of parts is reduced, thereby reducing the board size and cost.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
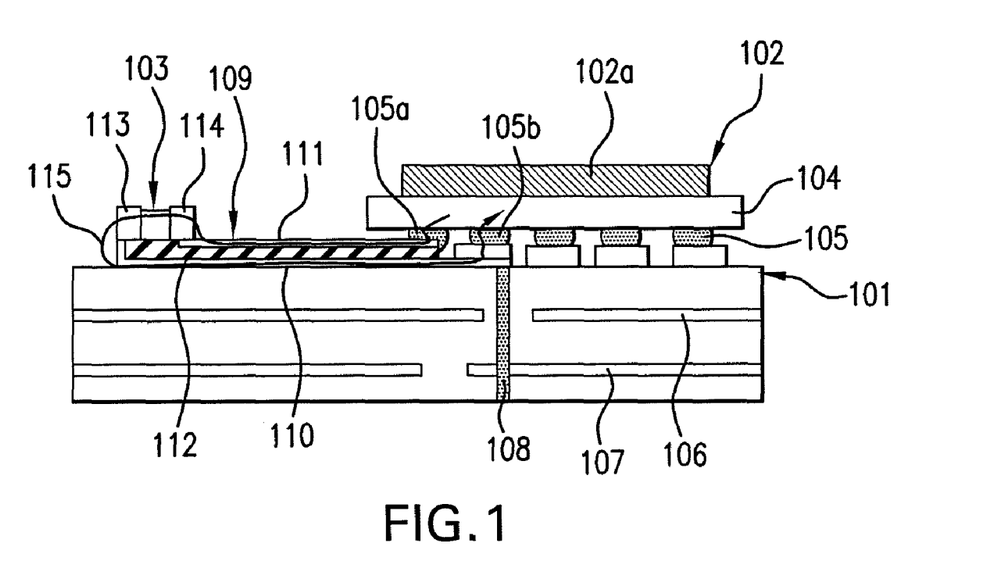
FIG. 1 is a cross-sectional view showing a configuration of a semiconductor device according to a first embodiment of the present invention.
Figure 2:
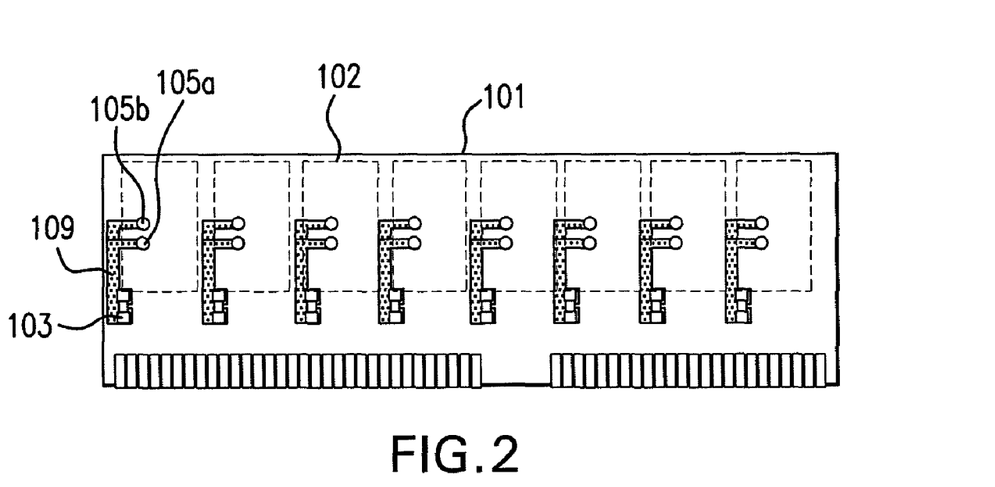
FIG. 2 is a planer view showing an LSI and a decoupling capacitor in the semiconductor device according to the first embodiment of the present invention.

FIG. 1 is a cross-sectional view showing a configuration of a semiconductor device according to a first embodiment of the present invention. FIG. 2 is a planer view showing an example of mounting an LSI and a decoupling capacitor according to the present first embodiment of the present invention.

First, with reference to FIG. 1, one example of the configuration of the semiconductor device according to the present first embodiment will be described. The semiconductor device according to the present first embodiment is, for example, a memory module including a printed wiring board having an LSI such as a DRAM mounted thereon. As shown in FIG. 1, the semiconductor device of the first embodiment includes a printed wiring board 101 having an LSI 102 such as a DRAM, a decoupling capacitor 103, and a thin-film capacitor 109 etc. mounted thereon. The LSI 102 comprises an LSI chip 102a and an LSI package 104. The LSI chip 102a is loaded on the LSI package 104, and respective terminals of the LSI chip 102a including a power-supply (power) terminal are connected to BGA (Ball Grid Array) balls 105 on a back surface of the LSI package 104. The BGA balls 105 are connected to respective electrodes on the printed wiring board 101. The printed wiring board 101 has a multilayer structure and embeds a power layer 106 for supplying power to the LSI 102 and a ground layer 107. A grounding BGA ball 105b and the ground layer 107 are connected via a VIA (through-hole) 108. Similarly, a power BGA ball 105a and the power layer 106 are connected via a VIA (not shown).

The LSI 102 has: the grounding BGA ball (first electrode) 105b for gaining power supply from the printed wiring board 101; and the power BGA ball (second electrode) 105a, and the grounding BGA ball 105b and the power BGA ball 105a are provided adjacent to each other.

The thin-film capacitor 109 is a wiring member for connecting the grounding BGA ball 105b and the power BGA ball 105a to the decoupling capacitor 103, and formed of a metal electrode plate 110 (first metal electrode plate), a metal electrode plate 111 (second metal electrode plate), and a dielectric film 112 etc. The dielectric film 112 is an insulating film having a thickness equal to or smaller than 1 µm, and formed of a high-permittivity material that contains, for example, nanoparticles of $BaSrTiO_3$ and the like. And, the dielectric film 112 is interposed between the metal electrode plate 110 and the metal electrode plate 111.

Further, the dielectric film 112 may be formed of an amorphous metal oxide including a metal alkoxide, a metal complex and/or a metal carboxylate as its main materials containing crystal particles of a metal oxide having a composition or composition ratio different from that of the amorphous metal oxide. In addition, the dielectric film 112 may contain paraelectric crystal particles expressed by a general formula of $(Ba_xSr_{1-x})TiO_3$ ($0<x<1$). Further, the amorphous metal oxide may be a metal oxide shown by a general formula of $Pb(Zr_yTi_{1-y})O_3$ ($0<y<1$).

The metal electrode plate 110 is formed of a first epitaxial electrode film. The dielectric film 112 is formed of an epitaxial dielectric film stacked on the metal electrode plate 110 (first epitaxial electrode film). The metal electrode plate 111 is formed of a second epitaxial electrode film stacked on the dielectric film 112. The constituent material of the dielectric film 112 (epitaxial dielectric film) has the perovskite structure. Further, the dielectric film 112 includes any one material of $BaTiO_3$, $CaTiO_3$, $SrTiO_3$, $BaMgO_3$, and PZT. The metal electrode plates (first and second epitaxial electrode films) 110, 111 include at least one material of a metal material group of Pt, Au, Ir, Pb, Rh, Cu, and Ag.

The decoupling capacitor 103 is mounted on the printed wiring board 101, and the decoupling capacitor 103 has a terminal (first terminal) 113 and a terminal (second terminal) 114. The grounding BGA ball 105b and the terminal 113 are connected by the metal electrode plate 110, and the power BGA ball 105a and the terminal 114 are connected by the metal electrode plate 111.

In such the configuration described above, a current path 115 of an AC component such as power noise between the power source of the LSI 102 and the ground is shown by an arrow.

FIG. 2 is a planer view showing a configuration example of the memory module according to the present first embodiment. As shown in FIG. 2, a plurality of the LSIs 102 such as DRAMs and the decoupling capacitors 103 are mounted on the printed wiring board 101. And, by the thin-film capacitor 109 having the configuration as shown in FIG. 1, the power BGA ball 105a and the grounding BGA ball 105b on the back of the LSI 102 are connected to the decoupling capacitor 103. In this manner, a thin-film capacitor of metal electrode plates interposing a dielectric film therebetween is used for a wiring member, thereby achieving lower inductance.

Next, an example of a method of manufacturing the thin-film capacitor 109 will be described.

For instance, paraelectric crystal particles are diffused in an amorphous metal oxide precursor including a metal alkoxide, a metal complex and/or a metal carboxylate as its main material, and a solution of the precursor is applied on the board, and then drying and baking are performed to fabricate the dielectric film 112.

The paraelectric crystal particle to use are only necessary to have paraelectricity in room temperature and it may be a dielectric material generally used for capacitors. For example, an oxide containing at least one of Ba, Sr, Ca, La, Ti, Ta, Zr, Cu, Fe, W, Co, Mg, Zn, Ni, Nb, Pb, Li, K, Sn, Al, and Sm can be used.

A method of manufacturing the oxide is only necessary to be capable of forming metal oxide particles such as a vapor deposition (chemical vapor deposition (CVD)), physical vapor deposition (PVD), solution technique (metal alkoxide method, coprecipitation method, reverse-micelle method, atomization method etc.), and so forth.

Further, to obtain a thin film, it is necessary to prevent aggregation between the particles as much as possible. The method of forming particles is preferred to be performed in a solution using a metal alkoxide, a metal complex and/or a metal carboxylate and the like, as compared with other methods. In this case, it is known that a metal oxide shown by $(Ba_xSr_{1-x})TiO_3$ ($0<x<1$) can be obtained by crystal particles directly by a sol-gel method, and the crystal particles obtained can be used.

For synthesis of the $(Ba_xSr_{1-x})TiO_3$ crystal particles in a solution, a metal alkoxide, metal complex, or metal carboxylate of Ba, Sr, or Ti can be used.

As the metal alkoxide, an alkoxide of alkoxyl group such as $OCH_3$, $OC_2H_5$, $OC_3H_7$, $OC_4H_9$, and $OC_2H_4OCH_3$ can be used.

As the metal complex compound, there are complexes of acetylacetone, benzoylacetone, benzoyltrifluoroacetone, benzoyldifluoroacetone, benzoylfluoroacetone and the like of the above-mentioned metals. And, as the metal carboxylate, for example, an acetic acid, an oxalic acid and the like can be used.

The particle diameter of the paraelectric crystal particle to be used is only necessary to be equal to or smaller than the thickness of the film. In the case of a dielectric crystal having ferroelectricity in a bulk, it is known that ferroelectric crystal particles fabricated by liquid deposition or vapor deposition generally show paraelectricity rather than ferroelectricity as the particle diameter becomes smaller.

For example, barium titanate shows paraelectric cubical crystal and not ferroelectric cubical crystal when the particle diameter is equal to or smaller than 120 nm. Therefore, when using a capacitor material which shows ferroelectricity in a bulk, it is necessary to make the particle diameter small enough not to show ferroelectricity in room temperature.

As a precursor compound to form an amorphous metal oxide dielectric, it is not limited as long as it is a compound which eventually becomes an amorphous metal oxide. It is preferable to choose at least one of a metal alkoxide, a metal complex, and a metal carboxylate.

Particularly, an amorphous metal oxide shown by a general formula of $Pb(Zr_yTi_{1-y})TiO_3$ (0<y<1) shows high permittivity, and if it is required to obtain a dielectric thin film having a high relative permittivity, it is effective to add metal oxide particles to the amorphous metal oxide shown by the above-shown general formula.

As the metal alkoxide, there are alkoxides of Ba, Sr, Ca, La, Ti, Ta, Zr, Cu, Fe, W, Co, Mg, Zn, Ni, Nb, Pb, Li, K, Sn, Al, Sm, etc. For example, a metal alkoxide of alkoxyl group such as $OCH_3$, $OC_2H_5$, $OC_3H_7$, $OC_4H_9$, and $OC_2H_4OCH_3$ can be used.

As metal complex compounds, there are complexes of acetylacetone, benzoylacetone, benzoyltrifluoroacetone, benzoyldifluoroacetone, benzoylfluoroacetone, and the like of the above-mentioned metals.

As the metal carboxylate, for example, an acetate is used, and there are particularly the following acetates. Barium acetate, copper acetate (II), lithium acetate, magnesium acetate, lead acetate, barium oxalate, calcium oxalate, copper oxalate (II), magnesium oxalate, tin oxalate (II) etc. can be used.

It is possible to change electric characteristics of the dielectric film 112, such as relative permittivity and dielectric loss.

The ratio of the paraelectric crystal particles and the amorphous dielectric precursor is not limited as long as it is able to be supplied in paste form. In view of dielectric characteristics, the effect is small when the amount of the paraelectric crystal particles is less than 20 mol % to a sum of the amorphous metal oxide and the paraelectric crystal particles. Further, in view of leakage current of the dielectric thin film, the amount is preferable to be equal to or smaller than 80 mol %.

Various methods of applying the metal oxide include bar coating, dip coating, roll coating, spin coating, and the like, depending on characteristics of the metal oxide precursor solution.

While the thickness of the film to be formed is not particularly limited, it is generally 5 nm to 50 μm. If a desired thickness cannot be obtained by one time of application, a plurality of times of application and drying are repeatedly performed, and then main baking is performed. Here, it is preferable to perform drying in 50 to 400° C. for about 30 seconds to 15 minutes and main baking in 200 to 400° C. for about 30 minutes to 2 hours.

Further, the thin-film capacitor 109 is made by forming a pair of electrodes facing to each other on both surfaces of the dielectric thin film described above. Note that, it is needless to say that the capacitor may be a stacked thin-film capacitor made by alternatively stacking the dielectric film and electrode.

The electrode to be used for the thin-film capacitor 109 is preferred to be a conductive material having a low electric resistance. Particularly, there are gold, copper, nickel, aluminum, platinum, tungsten, molybdenum, iron, niobium, titanium, a nickel/chrome alloy, an iron/nickel/chrome alloy, tantalum nitride, etc. In particular, copper is preferable because it has a small electric resistance.

The metal oxide thin film of the thin-film capacitor 109 can be formed without heating the board to near crystallization temperature of the metal oxide. In this case, organic materials feasible to deform in high temperature can be used for the insulating layer and the board material. Further, for the electrode and wiring, indium oxide and copper which react in high-temperature baking can be used.

Therefore, by the semiconductor device according to the present first embodiment, it is possible to realize both improvement of mounting density and noise reduction by the use of the thin-film capacitor as a power-supply path to the decoupling capacitor.

The use of the thin-film capacitor has a merit of lowering inductance as follows in contrast to conventional structures.

(1) As compared to a conventional structure in which a decoupling capacitor is arranged just near the power terminal of the LSI, in the case using the thin-film capacitor, even when the distance from the power terminal of the LSI to the decoupling capacitor is made 200 to 300 times away, a nearly identical inductance is obtained when the width of the thin-film capacitor is same with that of the normal power/grounding planes. Moreover, even when the width is one-tenth of the width of the normal power/grounding planes, the distance can be 20 to 30 times away. In this case, an effective inductance $L_{eff}$ of the thin-film capacitor is shown by the following equation.

$$L_{eff} = \mu h \cdot l / W$$

Here, μ is magnetic permeability, h is a distance between the power and grounding planes (thickness of the dielectric film 112), l is a distance (length of the metal electrode plates 110, 111), W is an electrode width (width of the metal electrode plates 110, 111). Note that, the distance of the power/grounding plates of general printed wiring board is 100 μm, and the distance between the plates of the thin-film capacitor is 0.3 to 0.5 μm.

(2) It becomes unnecessary to provide the wiring VIA between the LSI and the decoupling capacitor, thereby minimizing the power loop just under the LSI parts. Therefore, it is possible to minimize mounting inductance of the decoupling capacitor and the package.

According to the above merits, freedom of layout for mounting capacitors is increased, thereby enabling high density mounting.

Further, in accordance with the merits of lowering inductance as the above-said items (1) and (2), to the same target inductance, since it is possible to achieve the target inductance with less number of capacitors than conventional systems, it is expectable to gain effects of reducing the number of loading parts, and consequently, high-density mounting is expectable.

Second Embodiment

In a second embodiment, the thin-film capacitor 109 shown in the above first embodiment is changed to a general-purpose external wiring part.

Figure 3A:
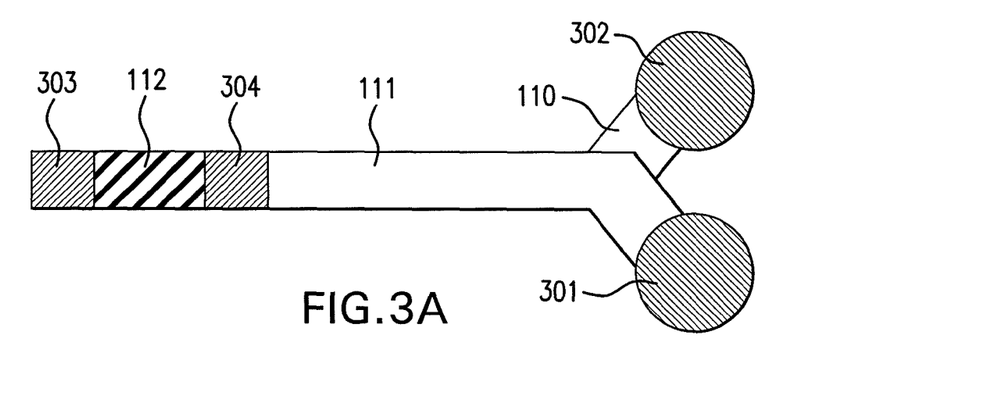
FIG. 3A is a planer view showing a configuration of a wiring part according to a second embodiment of the present invention.
Figure 3B:
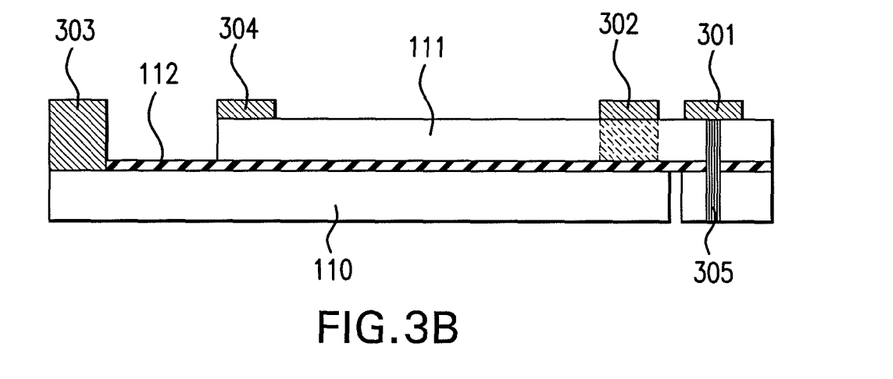
FIG. 3B is a cross-sectional view showing a configuration of the wiring part according to the second embodiment of the present invention.

FIG. 3A is a planer view showing a configuration of the wiring part according to the second embodiment of the present invention, and FIG. 3B is a cross-sectional view showing the same.

With reference to FIGS. 3A and 3B, one example of the configuration of the wiring part according to the present second embodiment will be described. The wiring part of the present second embodiment comprises, for example, the metal electrode plates 110, 111, the dielectric film 112, a power BGA ball electrode 301, a grounding BGA ball electrode 302, capacitor electrodes 303, 304, and so forth. The metal electrode plates 110, 111 and the dielectric film 112 are made of the same materials as those in the above first embodiment. Further, the wiring part formed by the metal electrode plates 110, 111 interposing the dielectric film 112 therebetween are fabricated in other process than that of the printed wiring board, and is fixed to the printed wiring board by soldering.

The metal electrode plate 110 has the grounding BGA ball electrode (first integrated circuit terminal) 302 to be connected to the grounding BGA ball (first power electrode) 105$b$ and the capacitor electrode (first capacitor terminal) 303 to be connected to the first terminal of the decoupling capacitor 103. The metal electrode plate 111 has the power BGA ball electrode (second integrated circuit terminal) 301 to be connected to the power BGA ball (second power electrode) 105$a$ and the capacitor electrode (second capacitor terminal) 304 to be connected to the second terminal of the decoupling capacitor 103. Note that, to make the mounting of the decoupling capacitor 103 and the LSI 102 easy, height differences among the upper surfaces of capacitor electrode 303, 304, the power BGA ball electrode 301, and the grounding BGA ball electrode 302 are made to be equal to or smaller than 100 μm.

In addition, the thickness of the dielectric layer 112 interposed between the metal electrode plate 110 and the metal electrode plate 111 is, similarly to the first embodiment, equal to or smaller than 1 μm. Further, the power BGA ball electrode 301 is connected to a lower electrode by a VIA 305, thereby making a connection to the electrode of the printed wiring board 101.

In other words, the metal electrode plate 110 has a first board terminal to be connected to the ground electrode of the printed wiring board 101, and the metal electrode plate 111 has a second board terminal to be connected to the power electrode of the printed wiring board 101. And, the grounding BGA ball electrode 302 and the first board terminal are arranged on different surfaces of the metal electrode plate 110, and the power BGA ball electrode 301 and the second board terminal are arranged on different surfaces of the metal electrode plate 111. There is provided an electrode (through-VIA 305) penetrating through the dielectric film 112 to electrically connect the grounding BGA ball electrode 302 and the first board terminal or an electrode stacked without interposing the dielectric film 112, and there is provided an electrode (through-VIA 305) penetrating through the dielectric film 112 to electrically connect the power BGA ball electrode 301 and the second board terminal or an electrode stacked without interposing the dielectric film 112.

Therefore, by the wiring parts of the second embodiment, as well as it is possible to obtain similar effects as those of the first embodiment, since the pattern of the capacitor electrode and the pattern of the power/grounding electrodes of the package are general-purposed, by making the parts general-purposed, it is possible to realize cost reduction.

Third Embodiment

A present third embodiment has electrodes increased compared to the external wiring parts described in the second embodiment above.

Figure 4:
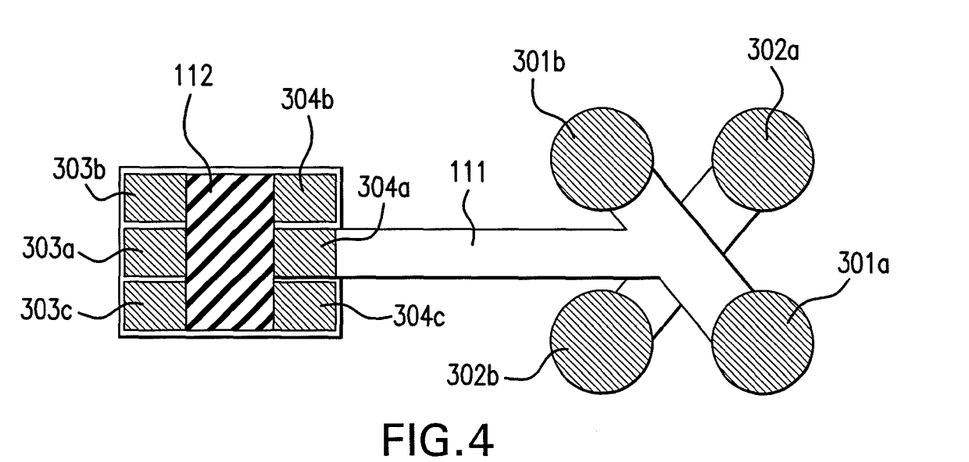
FIG. 4 is a planer view showing a configuration of a wiring part according to a third embodiment of the present invention.

FIG. 4 is a planer view showing a configuration of the wiring parts of the third embodiment.

As shown in FIG. 4, the metal electrode plate 110 has: a plurality of grounding BGA balls 302$a$, 302$b$ to be connected to the grounding BGA ball 105$b$; and a plurality of capacitor electrodes 303$a$, 303$b$, 303$c$ to be connected to the first terminal of the decoupling capacitor 103. The metal electrode plate 111 has: a plurality of power BGA ball electrodes 301$a$, 301$b$; and a plurality of capacitor electrodes 304$a$, 304$b$, 304$c$ to be connected to the second terminal of the decoupling capacitor 103.

Therefore, by the wiring parts of the third embodiment, as well as it is possible to obtain similar effects as those of the first and second embodiments, the capacitor electrode is capable of corresponding to a plurality of capacitors and a capacitor having multiple terminals depending on the shape of the electrode. And the BGA ball electrode is capable of corresponding to a plurality of electrodes depending on the shape of the electrode.

Fourth Embodiment

A present fourth embodiment has a thin-film resistor which is series-connected to the metal electrode plate of the thin-film capacitor of the semiconductor device described in the first embodiment so that the Q factor of the power-supply path to the decoupling capacitor via the thin-film capacitor is lowered. Normally, since the thin-film capacitor and the decoupling capacitor respectively have different capacitances, parasitic inductances, and parasitic resistances, they have different resonance frequencies. As a result, the impedance value becomes maximum at a nearly middle frequency between the resonance frequencies of the both capacitors due to antiresonance phenomenon of the impedance, and thus the power noise at this antiresonance frequency will be increased. The impedance maximum value at the antiresonance frequency can be suppressed by lowering the Q factor of the power-supply path, thereby suppressing power noise low.

Figure 5:
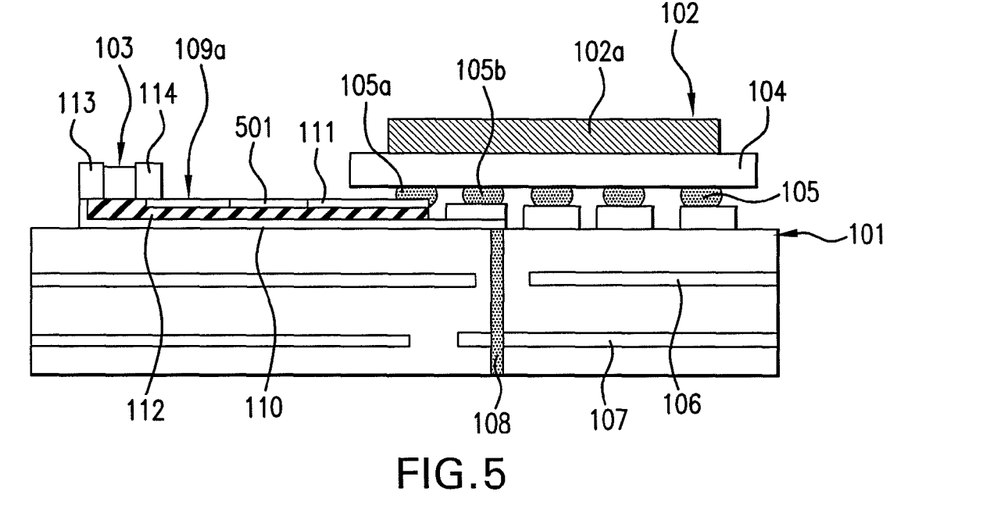
FIG. 5 is a cross-sectional view showing a configuration of a semiconductor device according to a fourth embodiment of the present invention.

FIG. 5 is a cross-sectional view showing a configuration of a semiconductor device according to the fourth embodiment of the present invention.

As shown in FIG. 5, a thin-film resistor 501 of a high-resistance material is connected to the metal electrode plate 111 and/or the metal electrode plate 110 in series. And, a loop resistance value R to the decoupling capacitor seen from the inside of the LSI 102 is adjusted so as to comply with the following equation.

$$R = (Le/Ct)^{0.5} |Cd-Ct|/Cd$$

Here, Le is a power supply loop inductance to the decoupling capacitor 103 seen from the inside of the LSI 102, Ct is a capacitance between the metal electrode plate 110 and the metal electrode plate 111, and Cd is a capacitance of the decoupling capacitor 103. Note that, this equation is obtained by solving a circuit calculation to get a resistance value in the case where the antiresonance impedance which occurs due to the two parallel capacitors (Ct, Cd) connected by the inductance Le and the resistor R takes the minimum value.

Therefore, by the semiconductor device according to the fourth embodiment, as well as it is possible to obtain similar effects as the first embodiment, the Q factor of the impedance profile, i.e., the peak value is decreased by adjusting the loop resistance R by the thin-film resistor, thereby realizing further power noise reduction.

Fifth Embodiment

A present fifth embodiment has a foldable thin-film capacitor made by using an organic material to the thin-film capacitor of the semiconductor device described in the first embodiment above.

Figure 6:
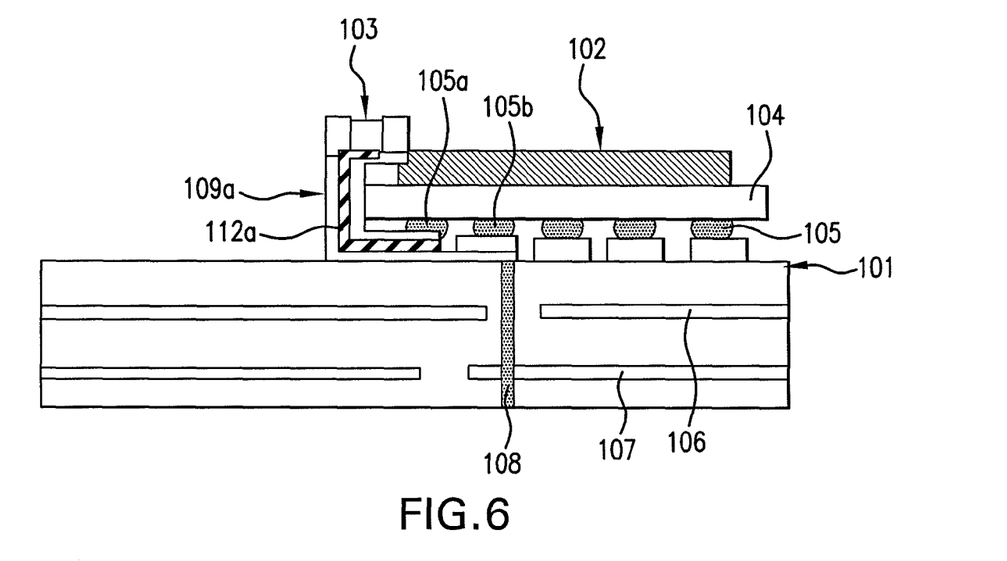
FIG. 6 is a cross-sectional view showing a configuration of a semiconductor device according to a fifth embodiment of the present invention.

FIG. 6 is a cross-sectional view showing a configuration of the semiconductor device according to the fifth embodiment of the present invention.

As shown in FIG. 6, an organic material (aromatic-polyamide-base polymer material and the like) is used as a dielectric film 112a of a thin-film capacitor 109a. In this manner, the thin-film capacitor 109a is made foldable.

Therefore, by the semiconductor device according to the fifth embodiment, as well as it is possible to obtain similar effects as those of the first embodiment, the freedom of mounting is further increased since the thin-film capacitor is foldable.

Sixth Embodiment

A present sixth embodiment has a multilayer capacitor structure of thin-film capacitors instead of the decoupling capacitor in the semiconductor device described in the first embodiment above.

Figure 7:
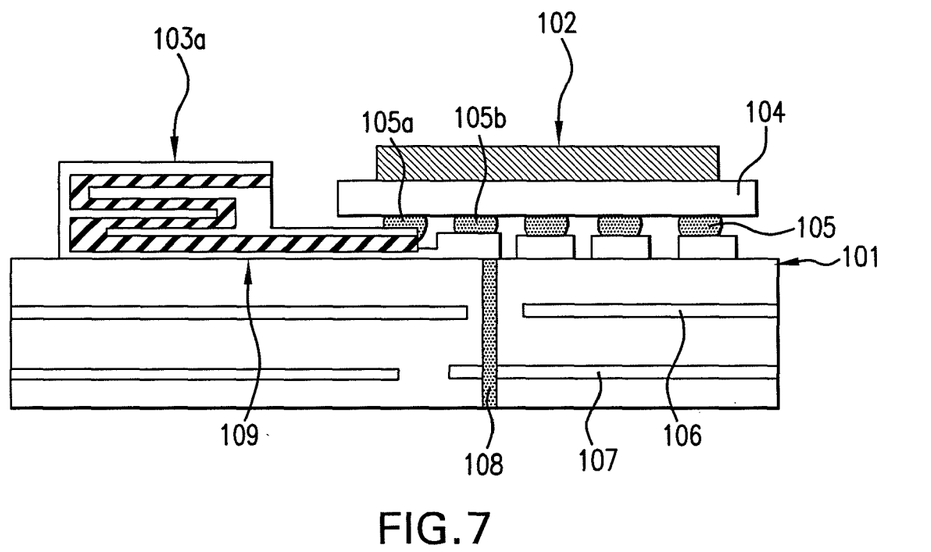
FIG. 7 is a cross-sectional view showing a configuration of a semiconductor device according to a sixth embodiment of the present invention.

FIG. 7 is a cross-sectional view showing a configuration of the semiconductor device according to the sixth embodiment.

As shown in FIG. 7, a decoupling capacitor 103a configures a multi-layer capacitor structure by thin-film capacitors. In this manner, the decoupling capacitor can be fabricated in a similar process as that of the thin-film capacitor 109.

Therefore, by the semiconductor device according to the sixth embodiment, as well as it is possible to obtain similar effects as those of the first embodiment, it is possible to fabricate the decoupling capacitor 103a in the same fabricating process as that of the thin-film capacitor 109, thereby reducing the number of mounting parts and costs.

Seventh Embodiment

A present seventh embodiment has a normal decoupling capacitor connected to the thin-film capacitor in the semiconductor device described in the first embodiment above, and connections are made between the power layer and the grounding layer and between the power BGA ball and the grounding BGA ball so as to be connected to other electrodes.

Figure 8:
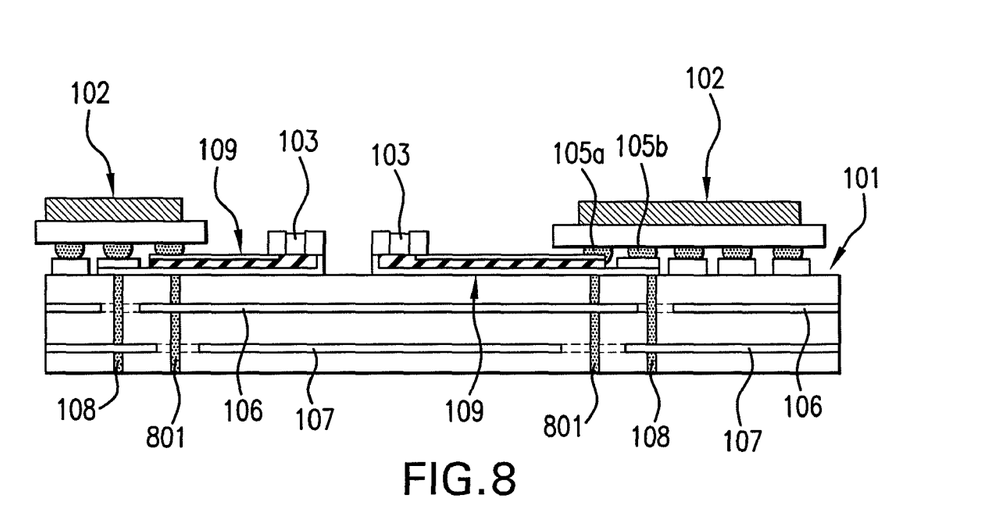
FIG. 8 is a cross-sectional view showing a configuration of a semiconductor device according to a seventh embodiment of the present invention.

FIG. 8 is a cross-sectional view showing a configuration according to the semiconductor device of the seventh embodiment of the present invention.

Normally, the decoupling capacitor 103 often has a large capacitance to decrease the impedance in the low-frequency range. However, since the ESL of large-capacitance capacitors is large, there are some cases incapable of adding a large-capacitance capacitor. Therefore, for the low-frequency range, it is necessary to decrease impedance by supports of other capacitors too in some cases. In addition, even when the mounting inductance is decreased, the ESL of the capacitor remains, and thus it is necessary to decrease impedance also in the high-frequency range by supports of other capacitors in some cases.

Accordingly, as shown in FIG. 8, the power BGA ball 105a, a power VIA 801 and the power layer 106 are connected, and the grounding BGA ball 105b, the grounding VIA 108 and the ground layer 107 are connected, thereby enabling connections of other capacitors.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, although a memory module loading an LSI such as a DRAM has been described in the foregoing embodiments, it is not limited to these, and is also applicable to a semiconductor device comprising a printed wiring board loading other LSIs.

The present invention is effectively applied to a memory module, a printed wiring board, other high-density mounting board and so forth.

What is claimed is:

1. A semiconductor device comprising a semiconductor integrated circuit and a printed wiring board on which the semiconductor integrated circuit is mounted,
   wherein the semiconductor integrated circuit has a first electrode and a second electrode to get power supply from the printed wiring board,
   wherein the first electrode and the second electrode are adjacently arranged,
   wherein a decoupling capacitor is mounted on the printed wiring board,
   wherein the decoupling capacitor has a first terminal and a second terminal,
   wherein the first electrode and the first terminal are connected by a first metal electrode plate,
   wherein the second electrode and the second terminal are connected by a second metal electrode plate, and
   wherein a dielectric film is interposed between the first metal electrode plate and the second metal electrode plate,
   wherein the first and second metal electrode plates interposing the dielectric film therebetween are fabricated as a wiring part in another process than that of the printed wiring board, and
   wherein the wiring part is fixed to the printed wiring board by soldering,
   wherein the first metal electrode plate is formed of a first epitaxial electrode film,
   wherein the dielectric film is formed of an epitaxial dielectric film stacked on the first epitaxial film,
   wherein the second metal electrode plate is formed of a second epitaxial electrode film stacked on the dielectric film, and
   wherein a constituent material of the epitaxial dielectric film has a perovskite structure.

2. The semiconductor device according to claim 1, wherein the dielectric film contains, in an amorphous metal oxide including a metal alkoxide, a metal complex and/or a metal carboxylate as a main material, metal oxide crystal particles having a composition or composition ratio different from that of the amorphous metal oxide.

3. The semiconductor device according to claim 2, wherein the dielectric film contains pararelectric crystal particles expressed by a general formula $(Ba_xSr_{1-x})TiO_3$ $(0<x<1)$.

4. The semiconductor device according to claim 2, wherein the amorphous metal oxide is a metal oxide expressed by a general formula $Pb(Zr_yTi_{1-y})O_3$ $(0<y<1)$.

5. The semiconductor device according to claim 1, wherein the epitaxial dielectric film includes any one material of $BaTiO_3$, $CaTiO_3$, $SrTiO_3$, $BaMgO_3$, and PZT.

6. The semiconductor device according to claim 1, wherein the first and second epitaxial electrode films include at least one or more materials among a metal material group of Pt, Au, Ir, Pb, Rh, Cu, and Ag.

7. The semiconductor device according to claim 1, wherein the decoupling capacitor configures a multilayer capacitor structure by thin-film capacitors.

8. The semiconductor device according to claim 1, wherein the dielectric film has a thickness equal to or smaller than 1 μm.

9. A wiring part to be mounted on a printed wiring board embedding a semiconductor device which includes a semiconductor integrated circuit, the wiring part comprising:
   a first metal electrode plate having a first capacitor terminal to be connected to a first terminal of a decoupling capacitor, and a first integrated circuit terminal to be connected to a first power electrode of the semiconductor integrated circuit; and a second metal electrode plate having a second capacitor terminal to be connected to a second terminal of the decoupling capacitor, and a second integrated circuit terminal to be connected to a second power electrode of the semiconductor integrated circuit, and wherein a dielectric film is interposed between the first metal electrode plate and the second metal electrode plate, wherein height differences among the first capacitor terminal, the second capacitor terminal, the first integrated circuit terminal, and the second integrated circuit terminal are equal to or smaller than 100 μm.

10. The wiring part according to claim 9, wherein a multiple number of the first capacitor terminals, the second capacitor terminals, the first integrated circuit terminals and/or the second integrated circuit terminals provided, respectively.

11. The wiring part according to claim 9, wherein the dielectric film has a thickness equal to or smaller than 1 μm.

12. The semiconductor device comprising a semiconductor integrated circuit and a printed wiring board on which the semiconductor integrated circuit is mounted, wherein the semiconductor integrated circuit has a first electrode and a second electrode to get power supply from the printed wiring board, wherein the first electrode and the second electrode are adjacently arranged, wherein a decoupling capacitor is mounted on the printed wiring board, wherein the decoupling capacitor has a first terminal and a second terminal, wherein the first electrode and the first terminal are connected by a first metal electrode plate, wherein the second electrode and the second terminal are connected by a second metal electrode plate, and wherein a dielectric film is interposed between the first metal electrode plate and the second metal electrode plate, wherein a thin-film resistor formed of a high-resistance material is included in a part of the first metal electrode plate and/or the second metal electrode plate, and wherein a loop resistance value to the decoupling capacitor seen from the inside of the semiconductor integrated circuit is $R=(Le/Ct)^{0.5}|Cd-Ct|/Cd$, where Le is a loop inductance to the decoupling capacitor seen from the inside of the integrated circuit, Ct is a capacitance between the first metal electrode plate and the second metal electrode plate, and Cd is a capacitance of the decoupling capacitor.

13. The semiconductor device according to claim 12, wherein the dielectric film contains, in an amorphous metal oxide including a metal alkoxide, a metal complex and/or a metal carboxylate as a main material, and metal oxide crystal particles having a composition or composition ratio different from that of the amorphous metal oxide.

14. The semiconductor device according to claim 13, wherein the dielectric film contains pararelectric crystal particles expressed by a general formula $(Ba_xSr_{1-x})TiO_3$ $(0<x<1)$.

15. The semiconductor device according to claim 13, wherein the amorphous metal oxide is a metal oxide expressed by a general formula $Pb(Zr_yTi_{1-y})O_3$ $(0<y<1)$.

16. The semiconductor device according to claim 12, wherein the first metal electrode plate is formed of a first epitaxial electrode film, wherein the dielectric film is formed of an epitaxial dielectric film stacked on the first epitaxial film, wherein the second metal electrode plate is formed of a second epitaxial electrode film stacked on the dielectric film, and wherein a constituent material of the epitaxial dielectric film has a perovskite structure.

17. The semiconductor device according to claim 16, wherein the epitaxial dielectric film includes any one material of $BaTiO_3$, $CaTiO_3$, $SrTiO_3$, $BaMgO_3$, and PZT.

18. The semiconductor device according to claim 16, wherein the first and second epitaxial electrode films include at least one or more materials among a metal material group of Pt, Au, Ir, Pb, Rh, Cu, and Ag.

19. The semiconductor device according to claim 12, wherein the dielectric film has a thickness equal to or smaller than 1 μm.

20. The semiconductor device comprising a semiconductor integrated circuit and a printed wiring board on which the semiconductor integrated circuit is mounted, wherein the semiconductor integrated circuit has a first electrode and a second electrode to get power supply from the printed wiring board, wherein the first electrode and the second electrode are adjacently arranged, wherein a decoupling capacitor is mounted on the printed wiring board, wherein the decoupling capacitor has a first terminal and a second terminal, wherein the first electrode and the first terminal are connected by a first metal electrode plate, wherein the second electrode and the second terminal are connected by a second metal electrode plate, and wherein a dielectric film is interposed between the first metal electrode plate and the second metal electrode plate, wherein the dielectric film is formed of an organic material, and wherein the first and second metal electrode plates interposing the dielectric film therebetween are foldable.

21. The semiconductor device according to claim 20, wherein the dielectric film contains, in an amorphous metal oxide including a metal alkoxide, a metal complex and/or a metal carboxylate as a main material, metal oxide crystal particles having a composition or composition ratio different from that of the amorphous metal oxide.

22. The semiconductor device according to claim 21, wherein the dielectric film contains pararelectric crystal particles expressed by a general formula $(Ba_xSr_{1-x})TiO_3$ $(0<x<1)$.

23. The semiconductor device according to claim 21, wherein the amorphous metal oxide is a metal oxide expressed by a general formula $Pb(Zr_yTi_{1-y})O_3$ $(0<y<1)$.

24. The semiconductor device according to claim 20, wherein the dielectric film has a thickness equal to or smaller than 1 μm.

25. The semiconductor device comprising a semiconductor integrated circuit and a printed wiring board on which the semiconductor integrated circuit is mounted, wherein the semiconductor integrated circuit has a first electrode and a second electrode to get power supply from the printed wiring board, wherein the first electrode and the second electrode are adjacently arranged, wherein a decoupling capacitor is mounted on the printed wiring board, wherein the decoupling capacitor has a first terminal and a second terminal, wherein the first electrode and the first terminal are connected by a first metal electrode plate, wherein the second electrode and the second terminal are connected by a second metal electrode plate, and wherein a dielectric film is interposed between the first metal electrode plate and the second metal electrode plate, wherein the first and second metal electrode plates interposing the dielectric film therebetween are fabricated as a wiring part in another process than that of the printed wiring board, and wherein the wiring part is fixed to the printed wiring board by soldering, wherein the printed wiring board has a first power layer and a second power layer, wherein the first electrode and the first power layer are connected, and wherein the second electrode and the second power layer are connected.

26. A semiconductor device comprising:

a wiring board mounting a semiconductor integrated circuit and including a first power supply terminal formed on a surface of the wiring board, and coupled to a first power supply electrode of the semiconductor integrated circuit and a second power supply terminal formed on said surface and coupled to a second power supply electrode of the semiconductor integrated circuit;

a first conductive layer formed on said surface including one end coupled to said first power supply terminal;

a dielectric film formed on said first conductive layer; and a second conductive layer formed on said dielectric film including one end coupled to said second power supply terminal, wherein the first conductive layer is a first epitaxial electrode film, wherein the dielectric film is an epitaxial dielectric film formed on the first epitaxial film, wherein the second conductive layer is a second epitaxial electrode film formed on the dielectric film, and wherein a constituent material of the epitaxial dielectric film has a perovskite structure.

27. The semiconductor device according to claim 26, wherein said first conductive layer includes an other end, said one end and said other end being electrically coupled to each other without using a via formed in said wiring board.

28. The semiconductor device according to claim 27, wherein said second conductive layer includes another end coupled to one end of a decoupling capacitor and wherein the other end of said first conductive layer is coupled to the other end of said decoupling capacitor.

29. The semiconductor device according to claim 26, wherein the dielectric film includes, in an amorphous metal oxide including a metal alkoxide, a metal complex and/or a metal carboxylate as a main material, metal oxide crystal particles having a composition or composition ratio different from that of the amorphous metal oxide.

30. The semiconductor device according to claim 26, wherein the dielectric film includes pararelectric crystal particles expressed by a general formula $(Ba_xSr_{1-x})TiO_3$ $(0<x<1)$.

31. The semiconductor device according to claim 26, wherein the dielectric film includes pararelectric crystal particles expressed by a general formula $Pb(Zr_yTi_{1-y})O_3$ $(0<y<1)$.

32. The semiconductor device according to claim 26, wherein the epitaxial dielectric film includes any one material of BaTiO3, CaTi03, SrTi03, BaMg03, and PZT.

33. The semiconductor device according to claim 26, wherein the first and second epitaxial electrode films include at least one or more materials among a metal material group of Pt, Au, Ir, Pb, Rh, Cu and Ag.

* * * * *